(12) United States Patent
Kim

(10) Patent No.: US 8,581,606 B2
(45) Date of Patent: Nov. 12, 2013

(54) TEST POINT STRUCTURE FOR RF CALIBRATION AND TEST OF PRINTED CIRCUIT BOARD AND METHOD THEREOF

(75) Inventor: Young-Ju Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 683 days.

(21) Appl. No.: 12/622,677

(22) Filed: Nov. 20, 2009

(65) Prior Publication Data

US 2010/0123473 A1 May 20, 2010

(30) Foreign Application Priority Data

Nov. 20, 2008 (KR) .................. 10-2008-0115689

(51) Int. Cl.
*G01R 31/00* (2006.01)
(52) U.S. Cl.
USPC ..................................... 324/750.02
(58) Field of Classification Search
USPC ............... 324/762.01–762.1, 750.01–750.3
See application file for complete search history.

(56) References Cited

U.S. PATENT DOCUMENTS

| | | | | |
|---|---|---|---|---|
| 6,753,679 | B1 * | 6/2004 | Kwong et al. | 324/750.3 |
| 7,276,921 | B2 * | 10/2007 | Perry | 324/750.27 |
| 2003/0107389 | A1 * | 6/2003 | Lyford | 324/754 |
| 2005/0212541 | A1 * | 9/2005 | Ruff et al. | 324/761 |
| 2006/0066575 | A1 * | 3/2006 | Brosnan et al. | 345/166 |

* cited by examiner

*Primary Examiner* — Tung X Nguyen
(74) *Attorney, Agent, or Firm* — Jefferson IP Law, LLP

(57) ABSTRACT

A point structure for RF calibration and testing of a PCB is provided. The point structure includes a test pad, an antenna connection pad, and a device mounting pad. The test pad is connected to a circuit unit of the PCB, and a ground pad is connected with a ground of the PCB. A contact probe apparatus for performing RF calibration and testing is connected to the test pad and the ground pad. The antenna connection pad is connected to an antenna unit. The device mounting pad is connected with the test pad and the antenna connection pad. An antenna device is mounted on the device mounting pad. The test pad, the ground pad, the antenna connection pad, and the device mounting pad are separated from one another. Since the point structure can replace an RF switch, a circuit area on the PCB may be reduced, a mounting space may be secured, and a manufacturing cost may be reduced.

14 Claims, 8 Drawing Sheets

TEST POINT — ANTENNA FEEDING LINE

TEST POINT STRUCTURE FOR RF CALIBRATION AND TEST OF PRINTED CIRCUIT BOARD AND METHOD THEREOF

PRIORITY

This application claims the benefit under 35 U.S.C. §119(a) of a Korean patent application filed in the Korean Intellectual Property Office on Nov. 20, 2008 and assigned Serial No. 10-2008-0115689, the entire disclosure of which is hereby incorporated by reference.

BACKGROUND OF THE INVENTION

1. Field of the Invention

The present invention relates to a point structure for Radio Frequency (RF) calibration and testing of a Printed Circuit Board (PCB) and a method thereof. More particularly, the present invention relates to a test point structure for RF calibration and testing of a PCB and a method thereof, to reduce manufacturing costs.

2. Description of the Related Art

Generally, a mobile communication terminal includes a Printed Circuit Board (PCB). The PCB includes a circuit unit, comprising a plurality of integrated circuits and various chips, for converting data into a signal that is suitable for transmission/reception, and for transmitting the signal via an antenna unit. The performance of the mobile communication terminal is verified through a predetermined appraisal method after the mobile communication terminal is manufactured and assembled, and then brought to the market after successfully passing the appraisal. One appraisal method is an appraisal of various circuit characteristics. For this purpose, a measurement apparatus measures various characteristics right before a signal propagates into space via an antenna. At this point, since it is difficult to properly detect a signal from the antenna unit, a connector is added right before a signal is transferred to the antenna unit in order to detect the signal. The connector interrupts the connection between the circuit unit and the antenna unit of the mobile communication terminal, and connects the circuit unit with the measurement apparatus. Here, the connector is called an RF switch.

However, in an aspect of manufacturing costs, the price of the RF switch is high, which results in a manufacturing cost increase.

SUMMARY OF THE INVENTION

An aspect of the present invention is to address at least the above-mentioned problems and/or disadvantages and to provide at least the advantages described below. Accordingly, an aspect of the present invention is to provide a test point structure that saves manufacturing costs of a mobile communication terminal.

Another aspect of the present invention is to provide a test point structure for RF calibration and testing of a PCB in order to measure characteristics of a circuit unit and an antenna unit of a mobile communication terminal, and a method thereof.

Yet another aspect of the present invention is to provide a test point structure for RF calibration and testing of a PCB and method thereof to reduce costs.

According to an aspect of the present invention, a test point structure for Radio Frequency (RF) calibration and testing of a Printed Circuit Board (PCB) is provided. The point structure includes a test pad connected to a circuit unit of the PCB, a ground pad connected with a ground of the PCB, an antenna connection pad connected to an antenna unit, and at least one device mounting pad respectively connected with the test pad and the antenna connection pad, and on which an antenna element is mounted, wherein the test pad, the ground pad, the antenna connection pad, and the element mounting pad are separated from one another.

According to another aspect of the present invention, a method for RF calibration and testing of a PCB including a test pad connected to a circuit unit of the PCB, and a ground pad connected with a ground of the PCB, an antenna connection pad connected to an antenna unit, and at least one device mounting pad respectively connected with the test pad and the antenna connection pad, and on which an antenna element is mounted, wherein the test pad, the ground pad, the antenna connection pad, and the element mounting pad are separated from one another, is provided. The method includes performing RF calibration and testing using a contact probe apparatus through the test pad and the ground pad.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a", "an", and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide a test point structure for Radio Frequency (RF) calibration and testing of a Printed Circuit Board (PCB), and a method thereof. More particularly, the present invention includes a test point structure for RF calibration and testing of a PCB to reduce manufacturing costs by replacing an RF switch, and a method thereof. Prior to describing exemplary embodiments of the present invention, a test point structure, which allows those skilled in the art to test an RF characteristic after removing an RF switch, will be described with reference to FIG. 1. A limitation of the test point structure will then be described with reference to FIGS. 2A to 3B.

Figure 1:
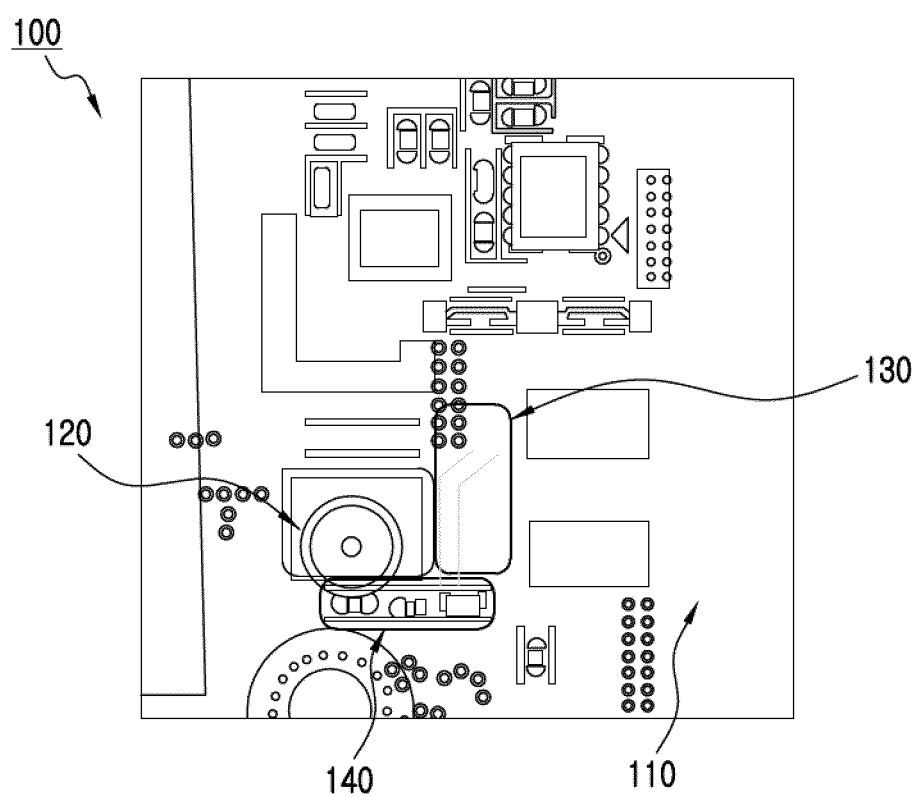
FIG. 1 is a view illustrating a Radio Frequency (RF) switch unit for measuring the performance of a mobile communication terminal.

FIG. 1 is a view illustrating an RF switch for measuring the performance of a mobile communication terminal.

Referring to FIG. 1, an RF switch unit 100 includes a PCB 110 including various circuit patterns, an RF switch 120 mounted on the PCB 110, and a plurality of additional devices also mounted on the PCB. In one implementation, the RF switch 120 is solder-fixed to the PCB 110 of the mobile communication terminal. The RF switch 120 is connected to a circuit pattern of the PCB 110 in order to connect with a circuit unit of the mobile communication terminal. Also, the RF switch 120 is connected to an antenna feeding line 130, which is one of the circuit patterns of the PCB 110, in order to connect with an antenna unit of the mobile communication terminal. The antenna feeding line 130 is connected with an antenna radiator (not shown) of the antenna unit. More particularly, the RF switch 120 is connected to a predetermined antenna matching element 140.

Figure 2A:
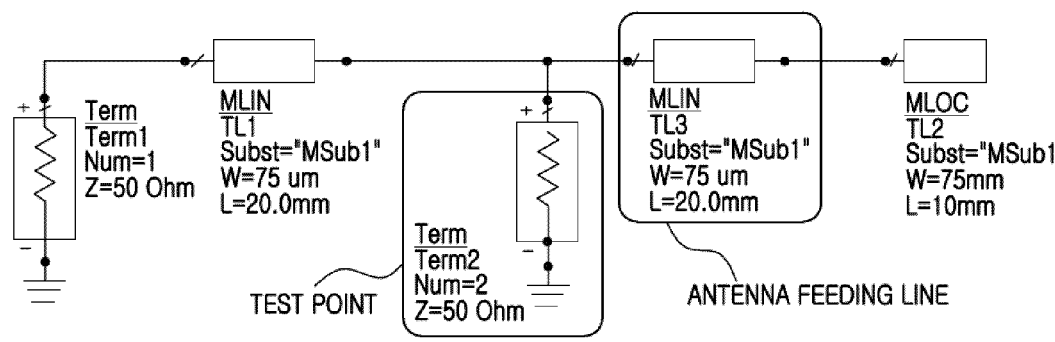
FIG. 2A is a Smith chart illustrating an equivalent circuit of a test point structure of a Printed Circuit Board (PCB) from which an RF switch has been removed, and an RF characteristic according to the equivalent circuit.
Figure 2A:
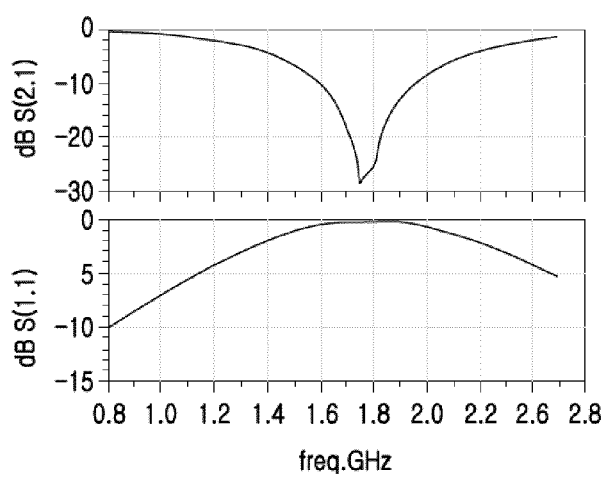
Figure 2A:
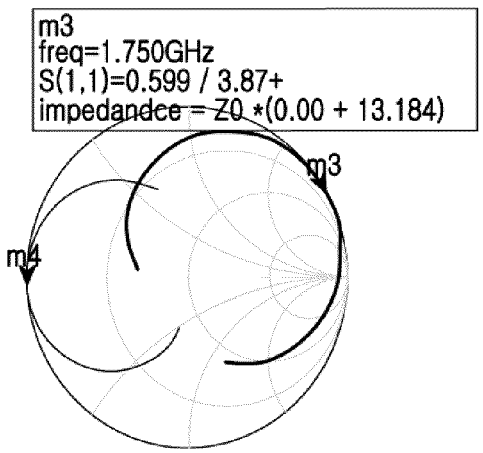
Figure 2A:
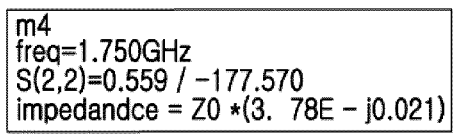
Figure 2B:
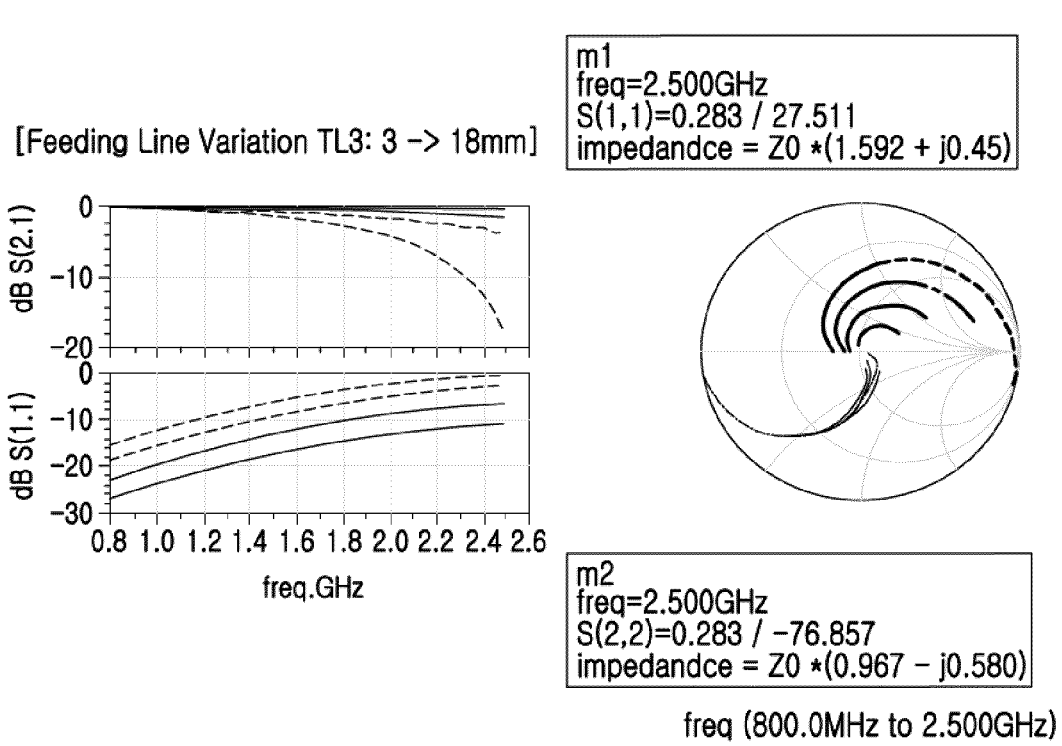
FIG. 2B is a Smith chart illustrating an RF characteristic depending on variations of a feeding line of an antenna of FIG. 2A.

FIG. 2A is a Smith chart illustrating an equivalent circuit of a test point structure of a PCB from which an RF switch has been removed from FIG. 1, and an RF characteristic according to the equivalent circuit. As illustrated in FIG. 2A, the equivalent circuit includes an antenna feeding line TL3. FIG. 2B is a Smith chart illustrating an RF characteristic depending on variations of the antenna feeding line TL3 of FIG. 2A.

Referring to FIGS. 2A and 2B, it is revealed that, in the case where the RF switch is removed and a test point structure is used, an RF characteristic changes depending on variations in the antenna feeding line TL3 (e.g., length change from 3 to 18 mm).

Figure 3A:
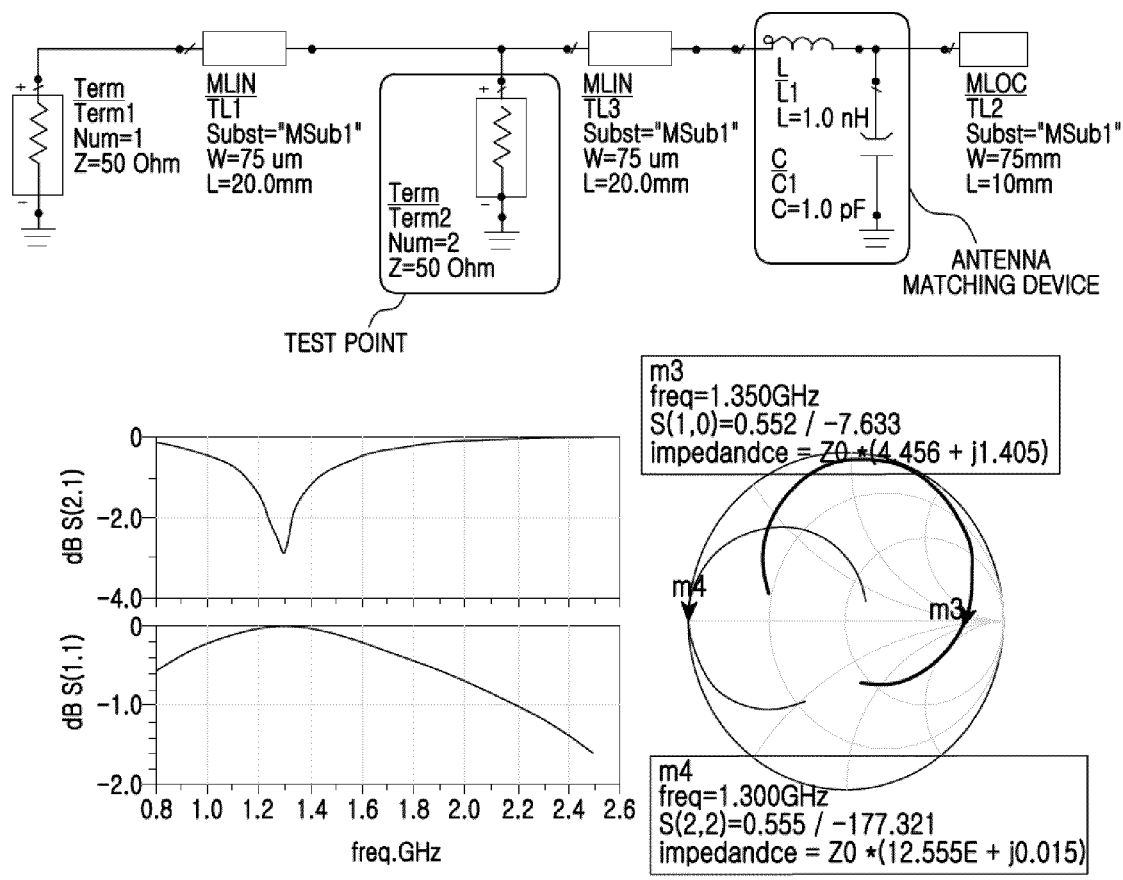
FIG. 3A is a Smith chart illustrating an equivalent circuit of a test point structure of a PCB after an RF switch has been removed, and an RF characteristic according to the equivalent circuit.
Figure 3B:
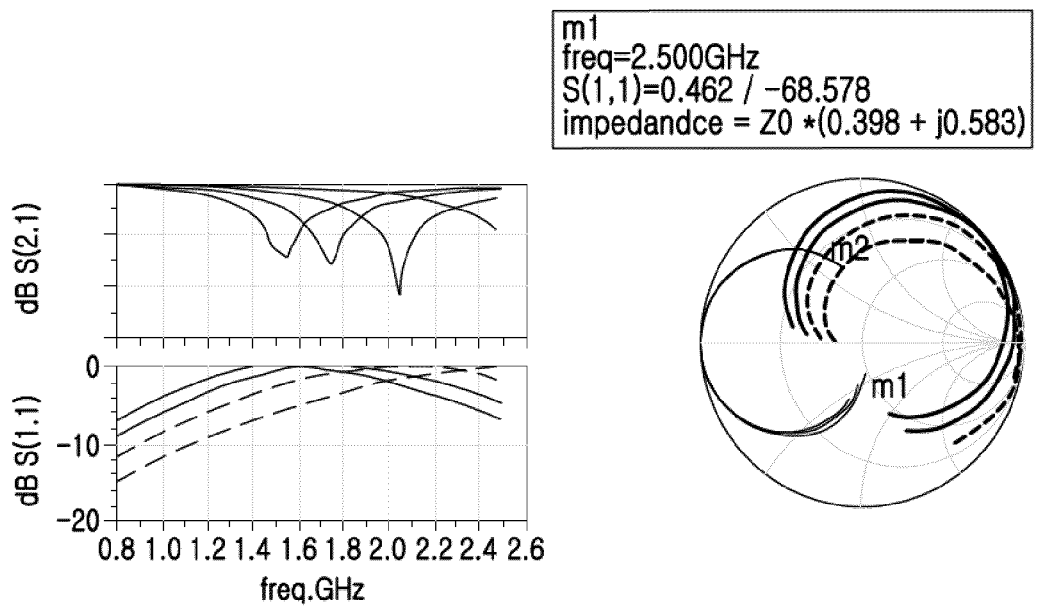
FIG. 3B is a Smith chart illustrating an RF characteristic depending on variations of an antenna matching element of FIG. 3A.

FIG. 3A is a Smith chart illustrating an equivalent circuit of a test point structure of a PCB after an RF switch has been removed from FIG. 1, and an RF characteristic according to the equivalent circuit. As illustrated in FIG. 3A, the equivalent circuit includes an antenna matching device having antenna matching elements such as an inductor L1 and a capacitor C1. FIG. 3B is a Smith chart illustrating an RF characteristic depending on the antenna matching element C1 of FIG. 3A.

Referring to FIGS. 3A and 3B, it is revealed that in the case where the RF switch is removed and a test point structure is used, an RF characteristic changes depending on variations in the antenna matching element C1 (e.g., capacitance change from 0.01 to 1.5 pF).

Therefore, as revealed from FIGS. 1 to 3B, in the case where an RF switch is removed and a test point structure is used, an RF characteristic changes depending on a length of an antenna feeding line and a value of an antenna matching element. Therefore, as described below, exemplary embodiments of the present invention provide an RF test point structure with consideration of parameters such as the length of the antenna feeding line and the value of an antenna matching element which have influence on the RF characteristic.

Figure 4A:
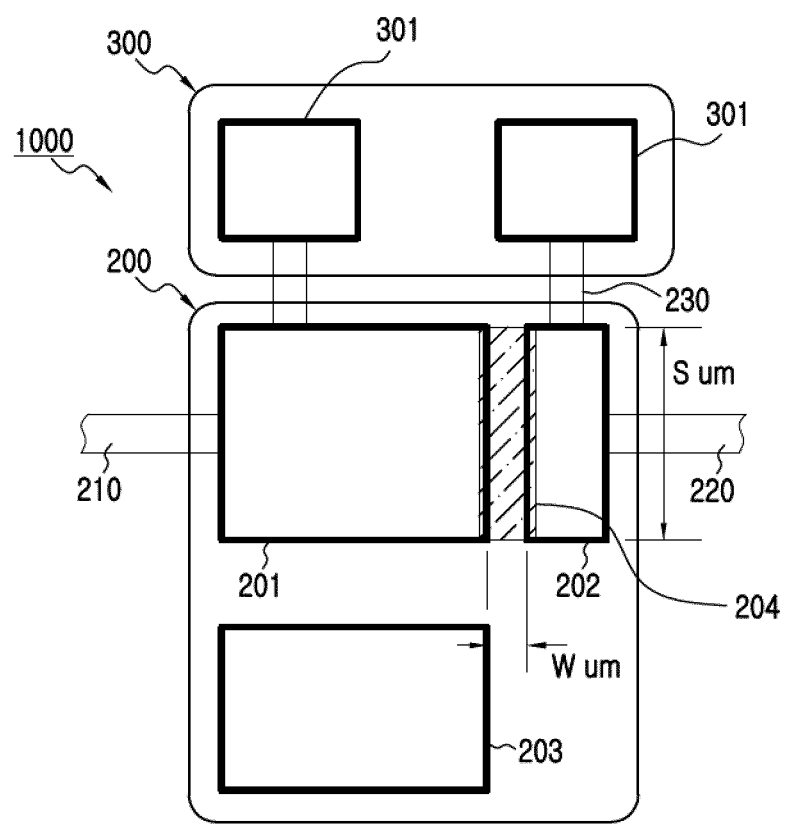
FIG. 4A is a schematic view illustrating a test point structure according to an exemplary embodiment of the present invention.
Figure 4B:
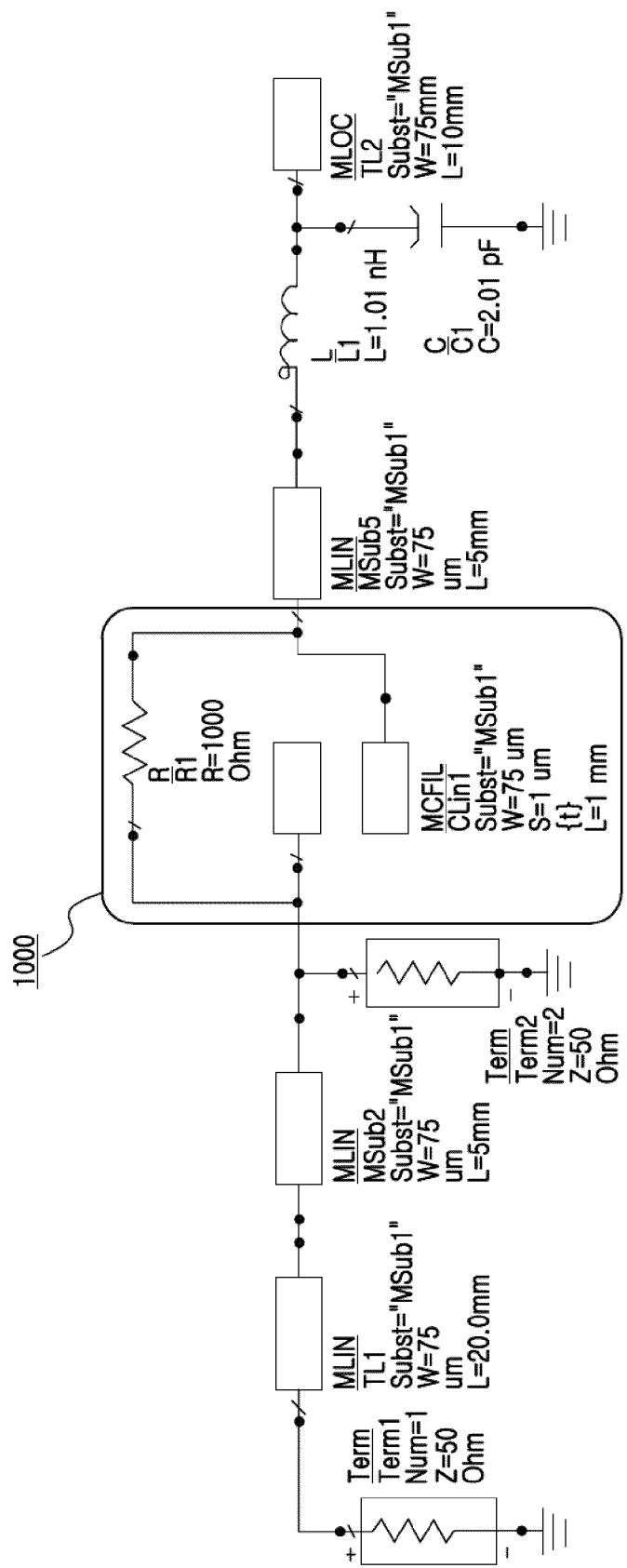
FIG. 4B is a view illustrating an equivalent circuit of an RF switch unit including a test point structure according to an exemplary embodiment of the present invention.

FIG. 4A is a schematic view illustrating a test point structure according to an exemplary embodiment of the present invention, and FIG. 4B is a view illustrating an equivalent circuit of an RF switch unit including a test point structure according to an exemplary embodiment of the present invention.

Referring to FIG. 4A, the test point structure 1000 includes an RF measurement unit 200 for measuring an RF characteristic, and a device mounting unit 300 electrically connected with the RF measurement unit 200 and having an antenna matching element mounted thereon.

The RF measurement unit 200 includes a test pad 201 for measurement, an antenna connection pad 202, and a ground pad 203 separated by a predetermined interval from the test pad 201 for measurement. The device mounting unit 300 includes at least one device mounting pad 301 for mounting an antenna matching element thereon. Here, the pads 201, 202, 203, and 301 may comprise thin metal plates exposed to the upper surface of the PCB.

The RF measurement unit 200 further includes an electrical connection unit 204 for connecting the test pad 201 for measurement with the antenna connection pad 202. As described below, the electrical connection unit 204 is used for connecting the test pad 201 for measurement with the antenna connection pad 202 after RF characteristic measurement performed during a manufacturing process of the mobile communication terminal, and before shipment.

In a case in which it is desired to measure an RF characteristic of a mobile communication terminal in order to detect a problem such as a defective product after shipment, the electrical connection unit 204 may be removed to separate the test pad 201 for measurement and the antenna connection pad 202. Therefore, the electrical connection unit 204 may be a mechanically detachable unit that is selectively attachable to the test pad 201 for measurement with the antenna connection pad 202. In an alternative embodiment, the electrical connection unit 204 may include soldering or otherwise electrically connect the test pad 201 for measurement and the antenna connection pad 202 in consideration of manufacturing cost reduction which is a point of the present invention.

The test pad 201 for measurement is connected to an input circuit pattern 210 that is connected to a circuit unit of the mobile communication terminal In addition, the antenna connection pad 202 is connected to an output circuit pattern 220 that is connected to the antenna unit of the mobile communication terminal. The ground pad 203 is connected to a ground of the PCB. The at least one device mounting pad 301 is connected to the test pad 201 for measurement and the antenna connection pad 202 by the medium of another circuit pattern 230. The respective circuit patterns 210, 220, and 230 are formed with consideration of arrangement and division of the pads 201, 202, 203, and 301 and the antenna matching element during a layout process of the PCB.

More particularly, as described in FIGS. 1 to 3B, an RF characteristic is influenced by parameters such as the antenna matching element 140 and the antenna feeding line (here, the output circuit pattern 220). Therefore, for example, the size (for example, S μm) of the antenna connection pad 202 connected to the output circuit pattern 220, and a separation distance (W μm) between the test pad 201 for measurement and the antenna connection pad 202 should be considered.

Figure 5:
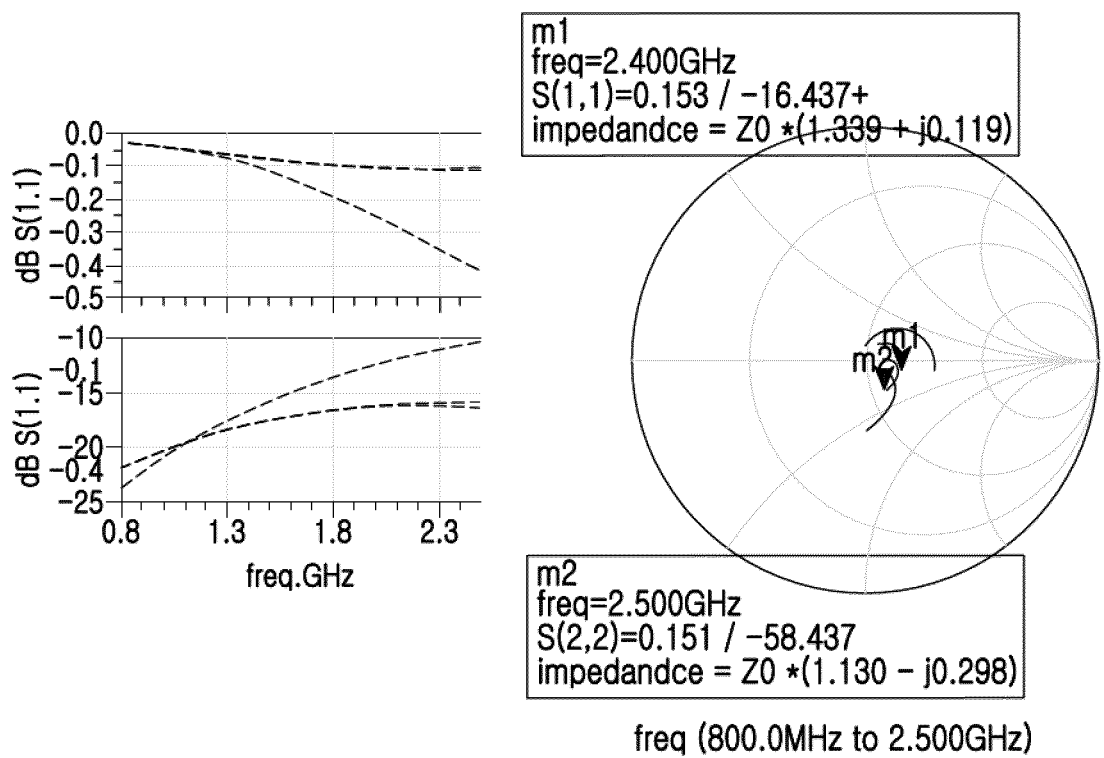
FIG. 5 is a Smith chart for deriving a simulation value for selecting distances S and W illustrated in FIG. 4A according to an exemplary embodiment of the present invention.

FIG. 5 is a Smith chart for deriving a simulation value for selecting distances S and W illustrated in FIG. 4A according to an exemplary embodiment of the present invention. The distances S and W may be selected with reference to FIG. 5. Also, the distances S and W should be selected with consideration of separation distances and sizes of the respective pads 201, 202, 203, and 301.

Therefore, those skilled in the art may perform RF calibration which corrects a difference between RF characteristics of RF elements using a contact probe apparatus through the test pad 201 for measurement and the ground pad 203. Also, those skilled in the art may finally perform a conduction test which tests whether a relevant communication band is normally performed through the test pad 201 and the ground pad 203.

After completing the RF calibration and the conduction test, the test pad 201 for measurement may be electrically connected with the antenna connection pad 202 by soldering.

In the case in which the antenna feeding line 220 and the antenna matching element have no influence on an RF characteristic, a dummy resistor of 0 ohm may be mounted onto the at least one device mounting pad 301 on which the antenna matching element is mounted. For example, a 1005 device and a dummy resistor may be mounted on the at least one device mounting pad 301. In the case where the dummy resistor is mounted, the soldering process is not required. That is, the dummy resistor provides a state which electrically connects the test pad 201 for measurement with the antenna connection pad 202.

Consequently, exemplary embodiments of the present invention may reduce a unit price of a mobile communication terminal by using a point structure for RF calibration and testing of a PCB and a method thereof.

Moreover, since an RF switch may be replaced by using a test point structure for RF calibration and testing of a PCB and a method thereof according to an exemplary embodiment of the present invention, a circuit area on the PCB may be reduced and a mounting space may be secured.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A test point structure for Radio Frequency (RF) calibration and testing of a Printed Circuit Board (PCB), the structure comprising:

a test pad connected to a circuit unit of the PCB;

a ground pad connected with a ground of the PCB;

an antenna connection pad connected to an antenna unit; and at least one device mounting pad respectively connected with the test pad and the antenna connection pad, and on which an antenna element is mounted, wherein the test pad, the ground pad, the antenna connection pad, and the at least one device mounting pad are mounted on a surface of the PCB, and wherein the test pad, the ground pad, the antenna connection pad, and the at least one device mounting pad are separated from one another.

2. The structure of claim 1, further comprising an electrical connection unit for detachably connecting the test pad and the antenna connection pad.

3. The structure of claim 1, further comprising a dummy resistor mounted on the at least one device mounting pad.

4. The structure of claim 1, wherein each of the test pad, the ground pad, the antenna pad, and the at least one device mounting pad comprises a thin plate for a substrate.

5. The structure of claim 1, wherein the test pad and the antenna connection pad are electrically connected by soldering.

6. The structure of claim 1, wherein a size of the antenna connection pad is determined based on RF characteristics of the PCB.

7. The structure of claim 1, wherein a distance between the test pad and the antenna connection pad is determined based on RF characteristics of the PCB.

8. A method for Radio Frequency (RF) calibration and testing in a test point structure of a Printed Circuit Board (PCB) comprising a test pad connected to a circuit unit of the PCB, a ground pad connected with a ground of the PCB, an antenna connection pad connected to an antenna unit, and at least one device mounting pad respectively connected with the test pad and the antenna connection pad, and on which an antenna element is mounted, wherein the test pad, the ground pad, the antenna connection pad, and the at least one device mounting pad are on mounted on a surface of the PCB, and wherein the test pad, the ground pad, the antenna connection pad, and the at least one device mounting pad are separated from one another, the method comprising:

performing RF calibration and testing using a contact probe apparatus through the test pad and the ground pad.

9. The method of claim 8, further comprising, after the performing of the RF calibration and testing, electrically connecting the test pad with the antenna connection pad.

10. The method of claim 9, wherein the electrically connecting of the test pad with the antenna connection pad comprises using a detachable connection.

11. The method of claim 9, wherein the electrically connecting of the test pad with the antenna connection pad comprises soldering.

12. The method of claim 8, further comprising, after the performing of the RF calibration and testing, mounting a dummy resistor on the at least one device mounting pad.

13. The method of claim 8, further comprising determining a size of the antenna connection pad based on RF characteristics of the PCB.

14. The method of claim 8, further comprising determining a distance between the test pad and the antenna connection pad based on RF characteristics of the PCB.

* * * * *